United States Patent [19]
Casselman

[11] Patent Number: 5,684,980
[45] Date of Patent: Nov. 4, 1997

[54] FPGA VIRTUAL COMPUTER FOR EXECUTING A SEQUENCE OF PROGRAM INSTRUCTIONS BY SUCCESSIVELY RECONFIGURING A GROUP OF FPGA IN RESPONSE TO THOSE INSTRUCTIONS

[75] Inventor: Steven Mark Casselman, Reseda, Calif.

[73] Assignee: Virtual Computer Corporation, Reseda, Calif.

[21] Appl. No.: 685,158

[22] Filed: Jul. 23, 1996

Related U.S. Application Data

[63] Continuation of Ser. No. 357,059, Dec. 14, 1994, abandoned, which is a continuation of Ser. No. 922,167, Jul. 29, 1992, abandoned.

[51] Int. Cl.$^6$ .................................................. G06F 19/00
[52] U.S. Cl. ............................................................ 395/500
[58] Field of Search ........................... 395/800; 364/488, 364/489, 490, 491, 578; 340/825.83, 825.86, 825.87

[56] References Cited

U.S. PATENT DOCUMENTS

| | | | |
|---|---|---|---|
| Re. 34,363 | 8/1993 | Freeman | 307/465 |
| Re. 34,444 | 11/1993 | Kaplinsky | 340/825.8 |
| 4,642,487 | 2/1987 | Carter | 307/465 |
| 4,786,904 | 11/1988 | Graham, III et al. | 340/825.83 |
| 4,935,734 | 6/1990 | Austin | 340/825.83 |
| 5,109,353 | 4/1992 | Sample et al. | 364/578 |

OTHER PUBLICATIONS

Dillen, Paul, *Adaptive Hardware Becomes a Reality using Electrically Reconfigurable Arrays (ERAs)*, IEE Colloquim on 'User–Configurable Logic—Technology and Applications', p. 2/1–10, 1 Mar. 1991.

Beal, Dr. Sam W., "Rapid Design Implementation with Field–Programmagle Gate Arrays," Digest of Papers, COMPCON Spring '89. Thirty–Fourth IEEE Computer Society International Conference: Intellectual Leverage, 1989, pp. 487–490.

Wood, Lawrence F. High Performance Analysis and Control of Complex Systems Using Dynamically Reconfigurable Silicon and Optical Fiber Memory. GTE, pp. 132–141 no date.

Gray, J.P. and Kean, T.A. Configurable Hardware: A New Paradigm for Computation. Pp. 279–295 no date provided.

Wolfe, Andrew and Shen, John P. A Promising Application–Specific Processor Design Approach. Proceedings of the IEEE 21st Annual Workshop on Microprogramming and Microarchitecture, Nov. 30–Dec. 2, 1998, pp. 30–39.

Bertin, P., Roncin, D., and Vuillemin, J. Introduction to Programmable Active Memories. Digital Paris Research Laboratory, Research Report No. 3, Jun., 1989, pp. 1–8.

Dillien, Paul and Phillips, Ian. ASIC Design Flexibility with ERAs. Electronic Product Design, Oct. 1989, pp. 29–34.

Hill, Dwight D. and Cassiday, Daniel R. Preliminary Description of Tabula Rasa, an Electrically Reconfigurable Hardware Engine. AT&T Bell Laboratories, 1990. pp. 391–395.

(List continued on next page.)

*Primary Examiner*—Richard L. Ellis
*Attorney, Agent, or Firm*—Michaelson & Wallace

[57] ABSTRACT

An array of FPGAs change their configurations successively during performance of successive user-defined algorithms. Adjacent FPGAs are connected through external field programmable interconnection devices (FPINs) or cross-bar switches. The array includes a processor-like device capable of performing the computations necessary to reconfigure the FPGAs in the array in accordance with the next algorithm to be performed. Preferably, this processor-like device is itself a "control" array of interconnected FPGAs which have been configured to emulate a selected microprocessor architecture which accepts user-defined primitives corresponding to an algorithm to be performed or a logic architecture to be emulated and reconfigure the FPGAs and the FPINs accordingly.

36 Claims, 13 Drawing Sheets

OTHER PUBLICATIONS

Kean, Tom and Gray, John. Configurable Hardware: Two Case Studies of Micro–Grain Computation. Journal of VLSI Signal Processing, vol. 2, 1990, pp. 9–16.

Hastie, Neil and Cliff, Richard. The Implementation of Hardware Subroutines on Filed Programmable Gate Arrays. Proceedings of the IEEE May 1990 Custom Integrated Circuits Conference, pp. 31.4.1–31.4.4.

Furtek, F., Stone, G. and Jones, I. Labyrinth: A Homogeneous Computational Medium. Proceedings of the IEEE May 1990 Custom Integrated Circuits Conference, pp. 31.1.1–31.1.4.

Petersen, T., Thomae, D. and Van den Bout, D. The Anyboard: A Rapid–Prototyping System for Use in Teaching Digital Circuit Design. Proceedings of the First International Rapid System Prototyping, Jun. 4–7, 1990, pp. 25–32.

Waugh, Thomas C. Field Programmable Gate Array Key to Reconfigurable Array Outperforming Supercomputers. Proceedings of the IEEE 1991 Custom Integrated Circuits Conference, pp. 6.6.1–6.6.3.

Gokhale, M., Holmes, W., Kopser, A., Lucas, S., Minnich, R., Sweely, D. and Lopresti, D. Building and Using a Highly Parallel Programmable Logic Array. Jan., IEEE, Jan. 1991, pp. 81–89.

Hartenstein, R., Hirschbiel, A., Riedmuller, M. Schmidt, K. and Weber, M. A Novel ASIC Design Approach Based on a New Machine Paradigm. IEEE, vol. 26, No. 7, Jul. 17, 1991.

FPGA VIRTUAL COMPUTER FOR EXECUTING A SEQUENCE OF PROGRAM INSTRUCTIONS BY SUCCESSIVELY RECONFIGURING A GROUP OF FPGA IN RESPONSE TO THOSE INSTRUCTIONS

This is a continuation, of application Ser. No. 08/357,059, filed Dec. 14, 1994, now abandoned which is a continuation of application Ser. No. 07/022,167, filed Jul. 29, 1992, now abandoned.

ORIGIN OF THE INVENTION

This invention was developed with support under contract number N60921-91-C-A330 from the Naval Surface Warfare Center.

BACKGROUND OF THE INVENTION

1. Technical Field

The invention is related to computers which out-perform supercomputers and in particular to computers comprising arrays of interconnected field programmable gate arrays (FPGA's).

2. Background Art

Field programmable gate arrays (FPGA's) were introduced by Xilinx, Inc. and are sold by Xilinx, Inc. under part no. XC4000, for example, and are described in U.S. Pat. No. 4,870,302 to Ross Freeman assigned to Xilinx, Inc. Their use has been explored by a number of workers, including Thomas C. Waugh of Xilinx, Inc., in "Field Programmable Gate Array Key to Reconfigurable Array Outperforming Supercomputers," *IEEE* 1991 *Custom Integrated Circuits Conference*, pages 6.6.1 through 6.6.3. This publication by Waugh discloses an array of FPGAs and software for configuring the FPGAs in the array in accordance with a user-defined problem. It discloses a software package called LDG distributed freely by the Supercomputing Research Center for configuring an array of Xilinx FPGAs to perform some user-defined algorithm. Xilinx, Inc. sells software packages, including one package entitled "The Xact Design Implementation System" for configuring a single FPGA chip in accordance with a set of user-defined primitives, Minc, Inc. has developed a multiple FPGA logic partition called "PLDesigner-XL". The concept of interconnected FPGAs has also been disclosed in U.S. Pat. No. 5,109,353 to Sample et al. and assigned to Quickturn Systems, Inc. and by Cox et al. of IBM Research Division, "Ganglion—A Fast Hardware Implementation of a Connectionist Classifier," *IEEE* 1991 *Custom Integrated Circuits Conference*, pages 6.5.1 through 6.5.4 and by Bertin et al. of Digital Equipment Corporation, Paris Research Laboratory, entitled "Programmable Active Memories: a Performance Assessment."

The problem with performing a complex algorithm, such as a fast Fourier transform (FFT) for example, in an array of interconnected FPGAs is that approximately 90% of the internal resources of each FPGA is consumed by the FPGA-to-FPGA interconnection requirements, as distinguished from the computational tasks required by the algorithm itself. This greatly impedes the performance and has seemed to be a fundamental limitation.

A fundamental problem in computing is that a conventional microprocessor executes successive instructions which must be input as instruction-defining-data into the microprocessor prior to execution thereof. Typically, the amount of instruction-defining-data corresponding to a single instruction exceeds the amount of data representing the operands required by the instruction. Thus, the necessity of loading instructions for each operation creates a fundamental barrier to computational speed.

SUMMARY OF THE INVENTION

The present invention includes an array of FPGAs whose configurations change successively during performance of successive algorithms or instructions, in the manner of a computer executing successive instructions. By configuring the array of FPGAs to perform an entire algorithm or set of instructions, the computing machine (i.e., the array of FPGAs) does not have to wait for each instruction to be down-loaded in performing each computational step.

In accordance with a second aspect, the invention further includes connecting adjacent FPGAs in an array of FPGAs through external field programmable interconnection devices (FPINs) or cross-bar switches in order to relieve the internal resources of the FPGAs from any external connection tasks. This solves the problem of having to employ 90% of the internal FPGA resources on external interconnection, thereby increasing performance nine-fold.

In accordance with a third aspect of the invention, the array of FPGAs forms a virtual computer, in that the array includes a processor-like device capable of performing the computations necessary to reconfigure the FPGAs in the array in accordance with the next algorithm to be performed. Preferably, this processor-like device is itself a "control" array of interconnected FPGAs which have been configured to emulate a selected microprocessor architecture (such as the Motorola 68000 microprocessor architecture). Thus, the virtual computer accepts user-defined primitives corresponding to an algorithm to be performed or a logic architecture to be emulated, and the control array of FPGAs processes the user-defined primitives and reconfigure the FPGAs and the FPINs accordingly. Then, the virtual computer is ready to operate on operand data.

In an initial embodiment of the invention, each FPIN is an IQ160 Field Programmable Interconnect Device sold by I-Cube Systems, Inc., and is configured in accordance with the FPGA-to-FPGA interconnection configuration bits generated by the Supercomputing Research Center's LDG software program.

In accordance with a fourth aspect of the invention, each FPIN is an array of general routing cells (GRC's) carrying two parallel bit streams of configuration bits. The array of GRC's permits one bit stream to shift in serially through the array in preparation for the next configuration change while simultaneously implementing the connections specified by the current set of configuration bits held stationary in the array. Then, upon change-over to the configuration of the next configuration bit stream, the first bit stream is shifted out and a following (third) bit stream is shifted in. In this manner, there is no delay imposed by the shifting in and out of configuration bits, provided that the computation time of each configuration exceeds the time required to shift the configuration bits in and out of the array. Moreover, some algorithms may lend themselves to alternating the array between two configurations many times, in which case no configuration bits need be shifted during computation once both streams of configuration bits have been loaded.

In accordance with a fifth aspect of the invention, the GRC array is spatially symmetrical, having an equal number of horizontal and vertical interconnect lines corresponding to interconnectable user I/O pins, with programmable interconnections between horizontal and interconnect lines. Permanent interconnections between horizontal and vertical lines permit incoming configuration bits to propagate through the GRC array in a serpentine path that passes through all GRC cells, so that the first configuration bit programs the last cell in the path while the last configuration bit programs the first cell in the serpentine path.

DETAILED DESCRIPTION OF THE INVENTION

Figure 1:
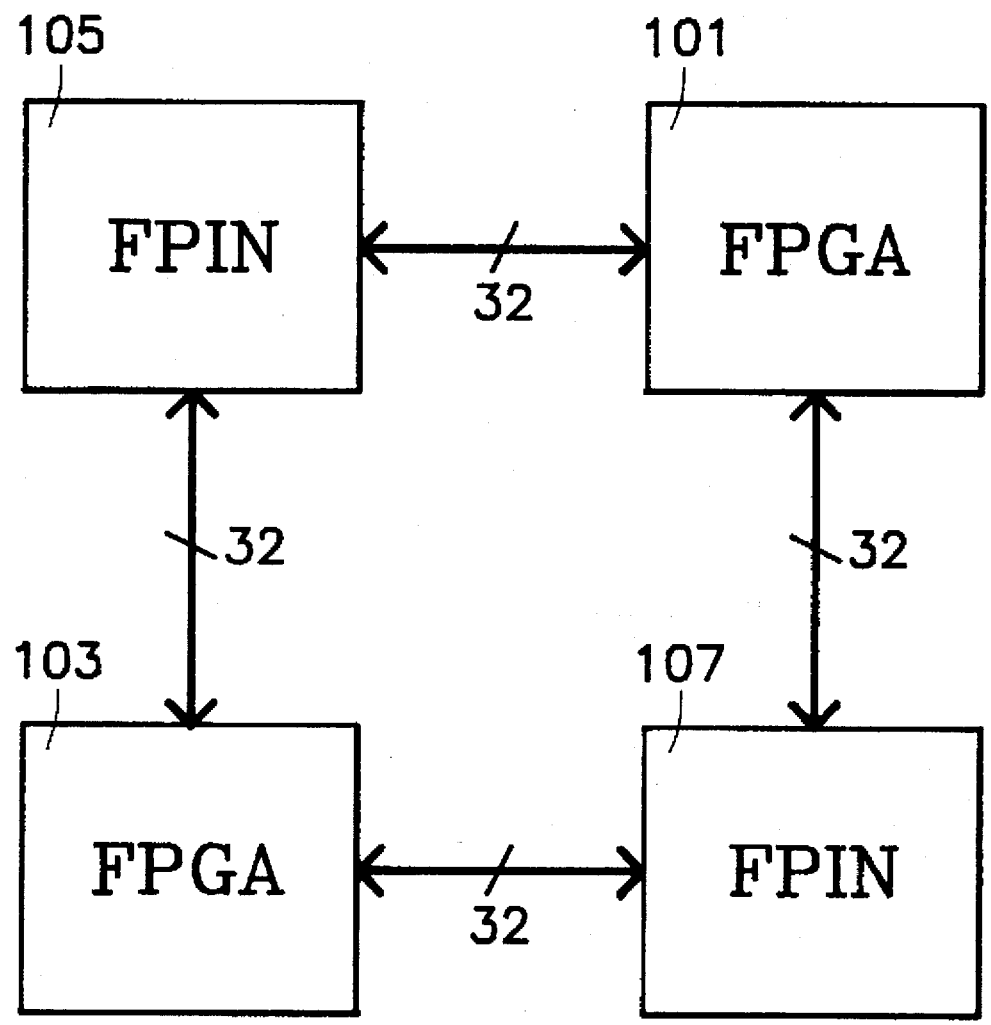
FIG. 1 is a simplified block diagram of an elementary cell of an array of FPGA's and FPIN's in accordance with the invention.

Referring now to FIG. 1, a basic cell or building block of a an array of FPGAs includes a pair of FPGAs 101, 103, which may be thought of as being located on opposite corners of a square, and a pair of FPINs 105, 107, which may be thought of as being located on the other opposing corners of the square. Each FPGA 101, 103 is connected to the two FPINs 105, 107, while each FPIN 105, 107 is connected to the two FPGAs 101, 103.

The internal logical architecture of each FPGA is reconfigurable to implement a user-selected algorithm or a portion of such an algorithm. Such reconfiguring may be achieved by processing a logical definition of the algorithm with a software package such as LDG software package distributed by the Supercomputing Research Center (SRC) to generate a file of configuration bits for each FPGA. Each FPGA is reconfigured by down-loading the corresponding configuration bit file into the FPGA, as will be described later in this specification. Each FPIN is reconfigured by using the bits specifying FPGA-to-FPGA connections in each configuration bit file produced by the LDG software package as an input to a software package such as FPID Pro developed by I-Cube Systems, Inc., to generate a file of configuration bits for each FPIN. Each FPIN is reconfigured by down-loading the corresponding configuration bit file into the FPIN, as will be described later in this specification. In this way, none of the internal logic resources of the FPGAs are wasted in effecting the FPGA-to-FPGA connections specified in the configuration bit files generated by the LDG software package.

In one implementation, each connection is between one bank of 32 user I/O pins of an FPGA and a corresponding bank of 32 user I/O pins of an FPIN, although the actual number of pins is a design choice. In this implementation, each FPGA is a Xilinx XC 4000 programmable gate array sold by Xilinx, Inc. at 2001 Logic Drive, San Jose, Calif. and each FPIN is an I-Cube IQ160 field programmable interconnect device sold by I-Cube Systems, Inc. at 2328-J Walsh Avenue, Santa Clara, Calif.

Figure 2:
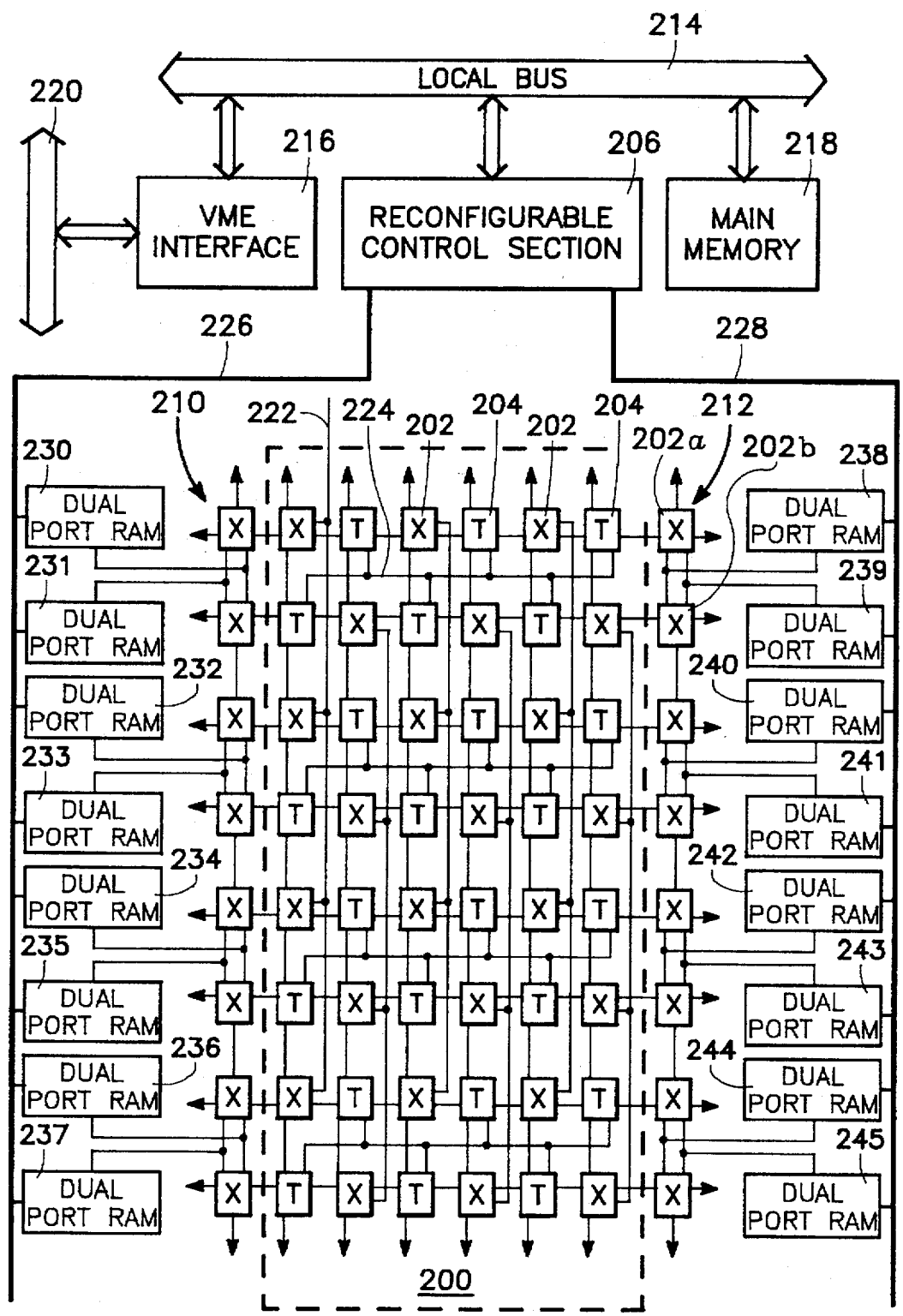
FIG. 2 is a block diagram of a virtual computer embodying the invention, including an array of FPGAs and FPINs comprising many cells of the type illustrated in FIG. 1.

FIG. 2 illustrates an array 200 of FPGAs 202 and FPINs 204 comprising many elementary cells of the type illustrated in FIG. 1. The array 200 of FIG. 2 may be employed as a coprocessor to enhance the performance of a host computer. However, in accordance with a further aspect of the present invention, the array 200 is comprised within a virtual computer illustrated in FIG. 2. The virtual computer of FIG. 2 is capable of successively reconfiguring the FPGAs and FPINs in the array 200 to perform successive algorithms, in analogy with a conventional microprocessor executing a set of successive instructions. However, each one of the successive algorithms performed by the virtual computer of FIG. 2 may correspond to many conventional instructions to be executed by a conventional microprocessor. Thus, rate at which the FPGAs and FPINs in the array 200 are successively reconfigured in performing a large computational task is less than the rate at which corresponding individual instructions would have to be loaded into a conventional microprocessor attempting to perform the same computational task at the same speed. In fact, therefore, by reconfiguring the FPGAs and FPINs in the array 200 at the maximum possible rate, the array 200 can perform a large computational task much faster than a conventional microprocessor.

For this purpose, the virtual computer of FIG. 2 includes a reconfigurable control section 206 governing the reconfiguration of all of the FPGAs and FPINs in the array 200 and capable of running software packages such as the LDG and FPID Pro software packages to generate the configuration bit files. Each configuration bit file thus generated is transmitted by the reconfigurable control section 206 to the corresponding FPGA or FPIN in the array 200.

The array 200 is connected to its left and to its right to respective columns 210, 212 of eight FPGAs (hereinafter, "column FPGAs"), alternate pairs of column FPGAs connected to pairs of dual port RAMs whose other ports are connected to the reconfigurable control section 206. A local bus 214 provides connection between the reconfigurable control section 206, a bus (VME) interface 216 and a main memory 218. The bus interface 216 is connected to a system bus 220. The 32-pin banks of the FPGAs 202 and FPINs 204 in the top row of the array 200 corresponding to the upward pointing arrows are connected to the 32-pin banks of the FPGAs 202 and FPINs 204 in the bottom row of the array 200 corresponding to the downward pointing arrows.

Figure 3:
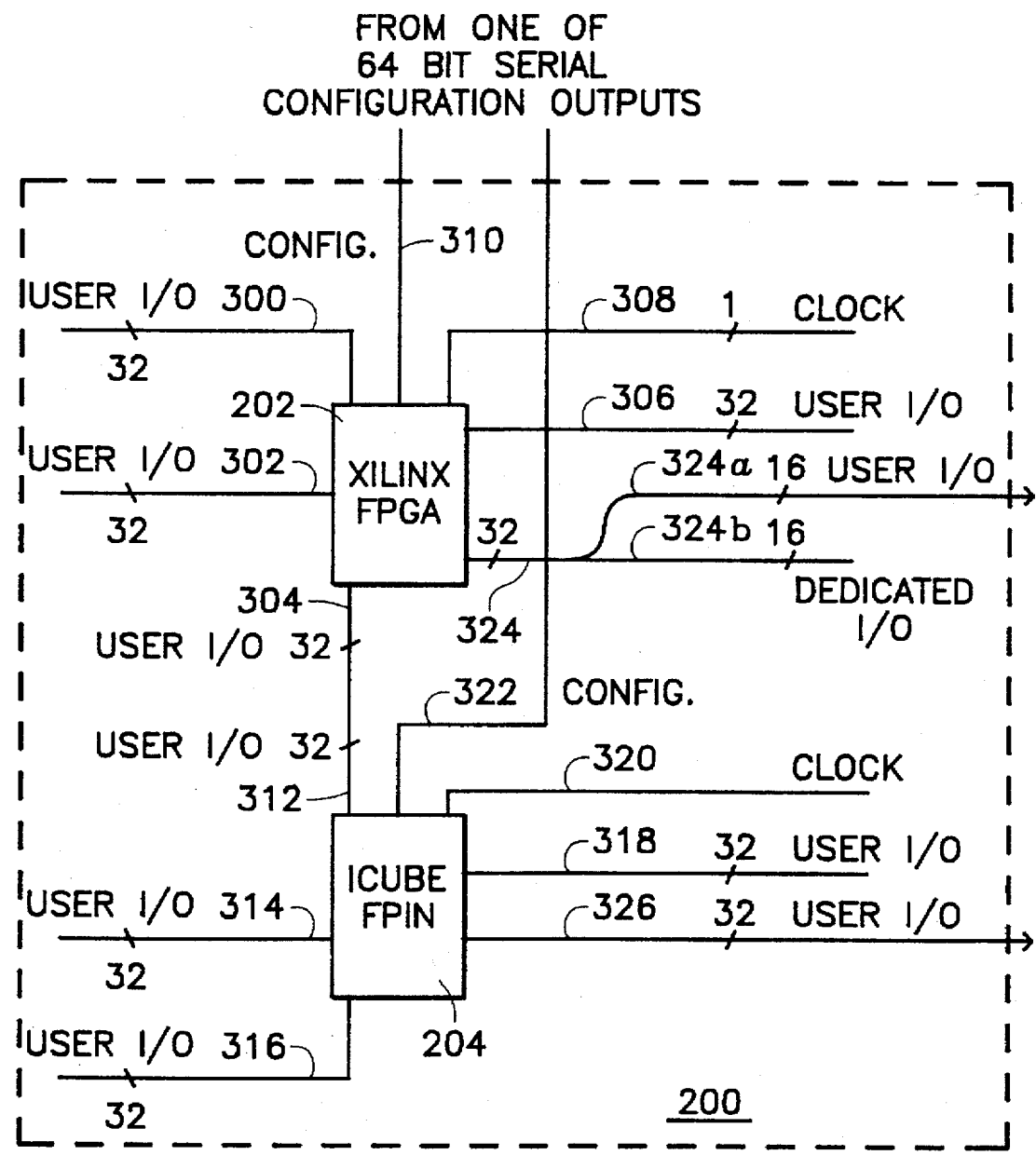
FIG. 3 is a block diagram illustrating pin connections between an FPGA chip and adjacent FPIN chip in the cell of FIG. 1.

As illustrated in FIG. 3, each FPGA 202 in the array 200 has four banks 300, 302, 304, 306 of thirty-two user I/O pins on its four sides connected to corresponding banks of thirty-two pins of four different FPINs 204. In addition, each FPGA 202 has a clock signal pin 308 and a configuration bit input pin 310 on which it receives the corresponding configuration file generated by the LDG software package executed by the reconfigurable control section 206. Each FPIN 204 in the array 200 has four banks 312, 314, 316, 318 of thirty-two pins on its four sides connected to corresponding banks of thirty-two pins of four different FPGAs 202. In addition, each FPIN has a clock signal pin 320 and a configuration bit input pin 322 on which it receives the corresponding configuration file generated by the FPID Pro software package executed by the reconfigurable control section 206.

Figure 4:
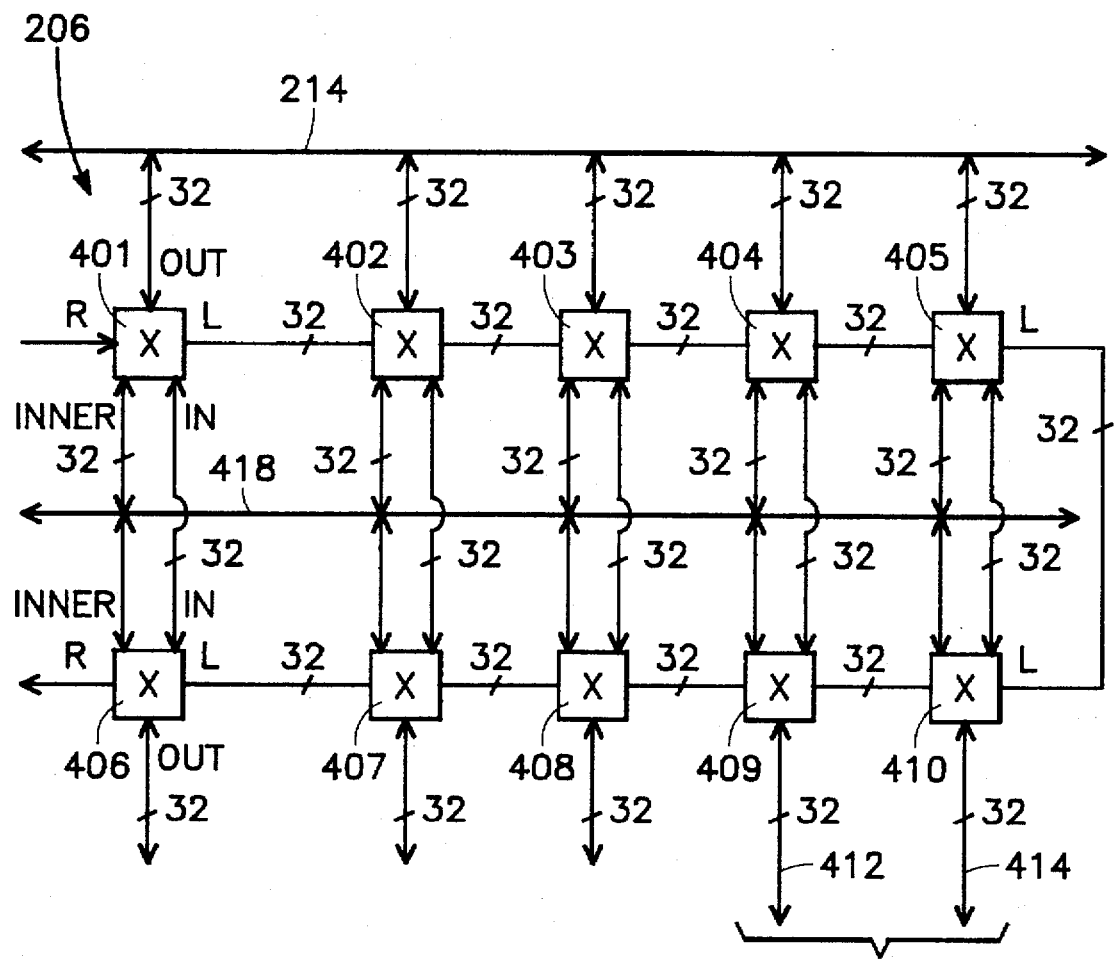
FIG. 4 is a block diagram of a reconfigurable control section of the virtual computer of FIG. 2.

FIG. 4 illustrates a preferred embodiment of the reconfigurable control section 206. The reconfigurable control section 206 of FIG. 4 has ten FPGAs 401–410 each identical to the FPGAs 202 in the array 200. The ten FPGAs 401–410 are connected directly together in this embodiment without the use of FPINs. In accordance with one aspect of the invention, the ten FPGAs 401–410 are configured using the LDG software (run on an external host not shown in FIG. 4) to emulate a standard microprocessor (such as a Motorola 68000). Once this is completed, the reconfigurable control section 206 is then used to run the LDG and FPID Pro software packages to generate the configuration bit files for reconfiguring the FPGAs 202 and FPINs 204 of the array 200 in accordance with a process to be described later herein. In order to load the configuration bit streams or files into each of the FPGAs 202 and FPINs 204 independently or simultaneously, some of the user I/O pins 412, 414 of each of the last two FPGAs 409, 410 of the reconfigurable control section 206 serve as configuration bit output pins dedicated to transmitting the configuration bit files to different ones of the FPGAs 202 and FPINs 204 in the array 200. For this purpose, different ones of the configuration bit output pins 412, 414 are individually connected to different configuration bit input pins 310 of the FPGAs 202 while others of the configuration bit output pins 412, 414 are individually connected to different configuration bit input pins 322 of the FPINs 204. The reconfigurable control section 206 is programmed to output the various configuration bit output files it has generated for the various FPGAs 202 and FPINs 204 on corresponding ones of the configuration bit output pins 412, 414. In the implementation illustrated in FIGS. 2, 3 and 4, the array 200 consists of exactly 24 FPGAs and 24 FPINs. In addition (for reasons that will be discussed later in this specification), the array 200 is bounded on its left and right (as viewed in FIG. 2) by left and right columns 210, 212, respectively, of consisting exclusively of exactly 8 FPGAs in each column, for a total of 16 additional FPGAs. Thus, there is a total of 40 FPGAs and 24 FPINs controlled by the reconfigurable control section 206, requiring a total of 64 configuration bit output pins. In order to meet this requirement, the configuration bit output bits 412, 414 comprise one bank of thirty-two user I/O pins on each one of the last two FPGAs 409, 410 of the reconfigurable control section 206.

In FIG. 4, the FPGAs 401 in the top row and 406 in the bottom row are typical, but are rotated with respect to one another in the horizontal plane by 180 degrees. Each one has five banks (labelled OUT, IN, R (RIGHT), L (LEFT) and INNER, respectively) of thirty-two pins each. In the reconfigurable control section 206, each one of the five banks participates in one of five connections. Specifically, the top five FPGAs 401, 402, 403, 404, 405 have their OUT banks connected to a local bus 214 while the bottom five FPGAs 406–410 have their OUT banks connected to the array 200. Of the latter, the OUT banks of the FPGAs 409 and 410 are the configuration bit output pins 412 and 414 discussed above, while the connection of the OUT banks of the FPGAs 406–408 to the array 200 will be discussed later in this specification. All ten FPGAs 401–410 have their IN banks of pairs of top and bottom FPGAs connected together, their INNER banks connected to an inner bus 418 and their LEFT and RIGHT banks connected to provide left-to-right pipeline connectivity. The inner bus 418 facilitates the reconfiguration of the array of FPGAs 401–410 in a microprocessor architecture capable of running object code compiled for a particular microprocessor. The LEFT bank of the FPGA 410 and the RIGHT bank of the FPGA 406 provide data ports, as do the local bus 214 and the inner bus 418.

The five banks of 32 pins of each FPGA 202 in the array 200 are allocated in the manner illustrated in FIGS. 2 and 3. Specifically, the four banks 300, 302, 304, 306 provide connection to the four adjacent FPINs 204 (i.e., to the top, bottom, left and right of each FPGA 202). A fifth bank 324 of thirty-two pins is divided in half, one sixteen-pin half bank 324a being used for interconnection to the fifth banks of all FPGAs 202 in the same column using a column global bus 222. Thus, each column global bus is a 16-bit bus. The other sixteen-pin half bank 324b is dedicated to control functions listed as "Permanently Dedicated Pins" on page 34 of the Xilinx technical manual for the XC4000 FPGA entitled *Xilinx Technical Data XC 4000 Logic Cell Array Family* (1990).

List of 16 I/O pin used as dedicated pins in the Array

| | |
|---|---|
| TDI | USED FOR BOUNDRY SCAN |
| TDO | " |
| TCK | " |
| TMS | " |
| M0 | USED FOR CONFIGURATION MODE |
| M1 | " |
| M2 | " |
| INIT | CONFIGURATION CONTROL AND STATUS |
| DIN | CONFIGURATION DATA IN |
| PGCK1-4 | TIED TO SYSTEM CLOCK |
| SGCK1-3 | GLOBALLY TIED TOGETHER FOR GLOBAL MESSAGES. |

The five banks of 32 pins of each FPIN 204 in the array 200 are allocated in the manner illustrated in FIGS. 2 and 3. Specifically, the four banks 312, 314, 316, 318 provide connection to the four adjacent FPGAs 202 (i.e., to the top, bottom, left and right of each FPIN 204). A fifth bank 326 of thirty-two pins is used for interconnection to all fifth banks of all FPINs 204 in the same row using a row global bus 224. Thus, each row global bus 224 is a 32-bit bus. There are four column busses 222 and four row busses 224. The column and row busses 222 and 224 enable global communication among the FPGAs 202 and the FPINs 204 respectively.

As described above with reference to FIG. 4, data flow between the reconfigurable control section 206 and the array 200 occurs at the 32-pin OUT banks of the FPGAs 406, 407 and 408 of the control section 206. For this purpose, array buses 226, 228 are connected to the 32-pin OUT banks of the FPGAs 406–408 and to the left and right FPGA columns 210 and 212 via dual port RAMs 230–245. The dual port RAMs 230–245 provide buffering between the data bursts received on the system bus 220 and the synchronous operation of the array 200.

The five 32-pin banks of each FPGA 202 in the left and right FPGA columns 210 and 212 may be labelled L (LEFT), R (RIGHT), OUT, IN and INNER in the same manner as the FPGA 406 of FIG. 4. With this analogy in mind, the connections between the dual port RAMs 230–245 and the left and right FPGA columns 210 and 212 are typified by the connection of the FPGA 202a at the top of the right FPGA column 212, as follows. The FPGAs in each column 210, 212 are paired, the IN and INNER banks of each FPGA within a pair being connected together and to a respective one of a pair of the dual port RAMs. Thus, the FPGA 202a is paired with the next FPGA down in the right FPGA column 212, namely the FPGA 202b. In the specific case of the FPGA 202a, the LEFT bank connects to the adjacent FPIN in the same row while the RIGHT bank is wrap-around connected to the left bank of the FPGA in the same row of the left FPGA column 210, the OUT bank is wrap-around connected to the OUT bank of the bottom FPGA of the right FPGA column 212. The OUT bank of the FPGA 202b is connected to the OUT bank of the next FPGA down in the same column. Thus, the right and left FPGA columns 210 and 212 are connected around the array 200 to each other from left to right, as indicated by the arrows extending away from the array 200. This latter feature, along with the top to bottom wrap around connection between the top and bottom rows of FPGAs and FPINs in the array 200 (described previously herein), connects the entire array 200 on a three-dimensional surface like a cube or sphere.

Figure 5:
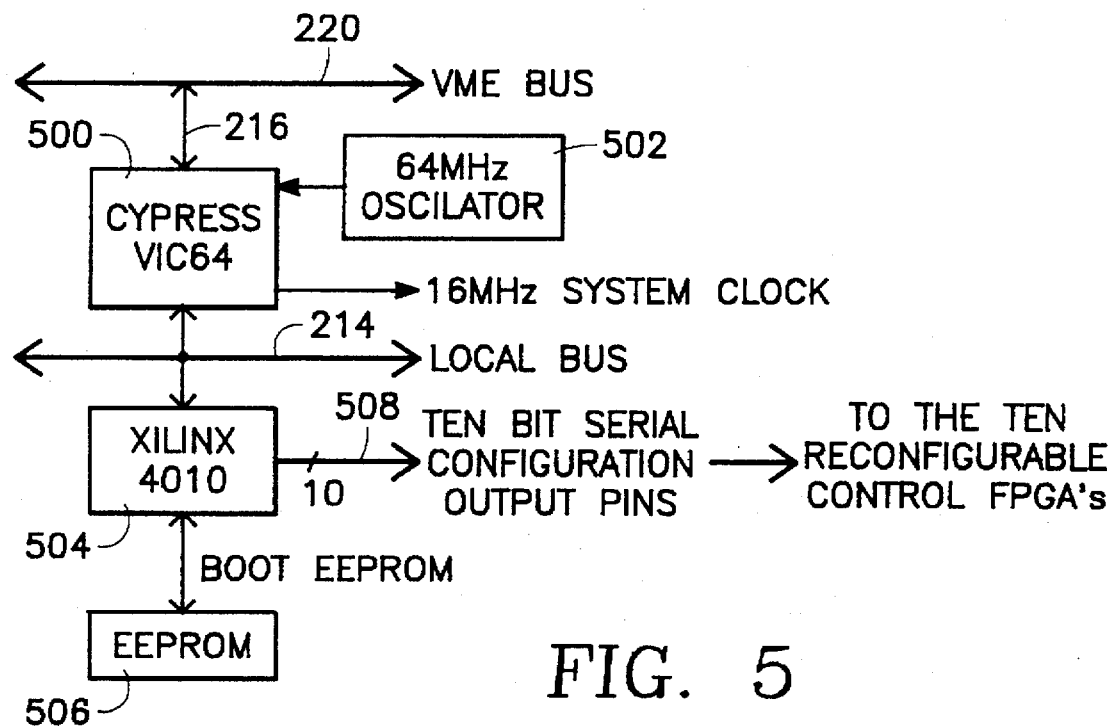
FIG. 5 is a block diagram of the VME interface section of the virtual computer of FIG. 2.

Referring to FIG. 5, the system bus 220 is a VME bus in one implementation and the bus interface 216 includes a VME interface chip 500, namely a Cypress VIC64 driven by a 64 MHz oscillator 502, connected to the system bus 220 at one port and to the local bus 214 at another port. A boot-up FPGA 504 has one set of its pins connected to the local bus 214 and another set of its pins connected to a boot EEPROM 506. Furthermore, the boot-up FPGA 504 has ten configuration bit output pins 508 connected to the configuration bit input pins (corresponding to pin 310 of FIG. 3) of the ten FPGAs 401–410 of the reconfigurable control section 206. The EEPROM 506 contains instructions which control and configure the boot-up FPGA 504 when power is first applied. These instructions cause the boot-up FPGA 504 to transmit via the ten output pins 508 ten configuration files to the configuration bit input pins of the ten FPGAs 401–410 of the reconfigurable output section 206. In a preferred embodiment, the information stored in the boot-up EEPROM 506 corresponds to the configuration files necessary to configure the FPGAs 410–410 in a microprocessor architecture. The EEPROM also enables the boot-up FPGA 504 to control the VME interface chip 500 in conformance with the configuration of the VME system bus 220.

Figure 6:
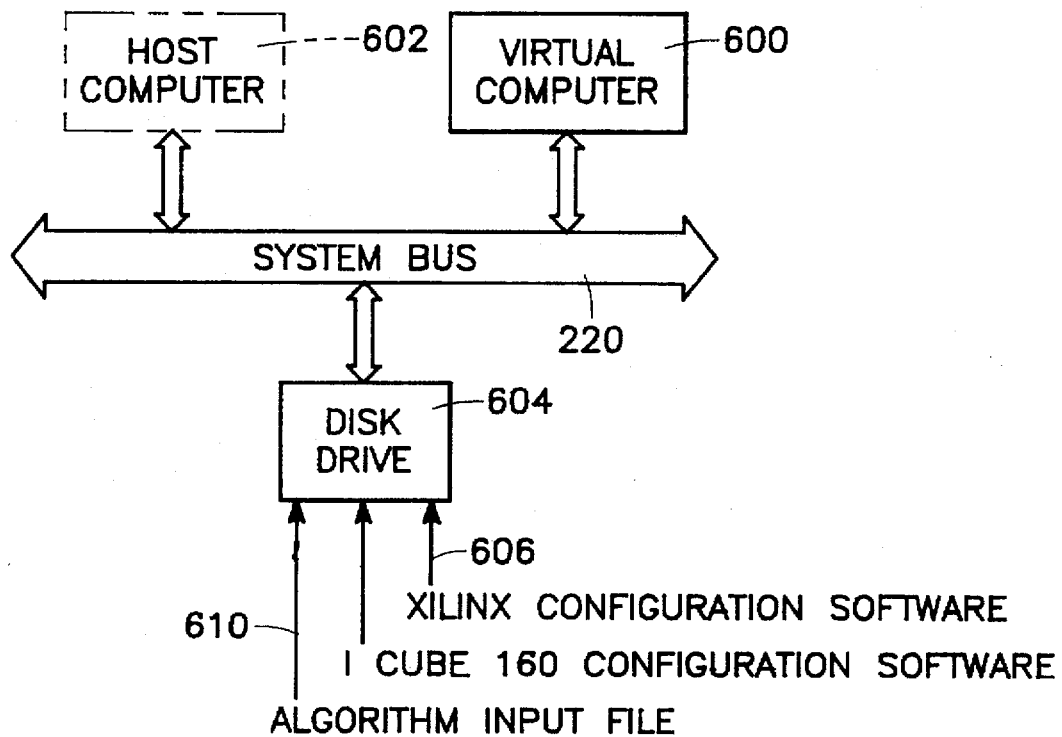
FIG. 6 is a block diagram of a virtual computing system, including a host computer temporarily connected to the system bus for initially programming the virtual computer.

FIG. 6 illustrates how to configure the virtual computer 600 of FIG. 2 immediately upon completion of manufacture. Specifically, a host computer 602 is connected to the system bus and a disk drive 604 is also connected to the bus 220. Software 606 such as the LDG program for configuring an array of Xilinx FPGAs is stored in the disk drive 604. Also, information specifying the configuration bit output pins 508 of the boot-up FPGA 504 and their assignment among the ten FPGAs of the reconfigurable control section 206 is stored in the disk drive 604. Finally, an array 610 of logic primitives corresponding to a selected microprocessor logic architecture (such as the logic architecture of the Motorola 68000 microprocessor) is stored on the disk drive 604. Then, the host computer 602 is instructed to run the LDG software package to process the array of logic primitives and generate configuration bit files for each of the ten FPGAs of the reconfigurable control section 206. These configuration bit files are then stored on the disk drive 604. Thereafter, they are used to program the boot-up EEPROM 506 so that the configuration files are downloaded into the corresponding control section FPGAs 401–410 and the system automatically configures the control section 206 to emulate the selected microprocessor each time it boots up. Thereafter, the system is a virtual computer ready to perform any user-defined algorithm.

As one option, the EEPROM 506 may store information enabling the system to boot up into one of several (e.g. eight) predetermined microprocessor configurations, depending upon a user-specified choice, enabling the user to instantly switch the system from one microprocessor architecture to another, as desired.

Figure 7:
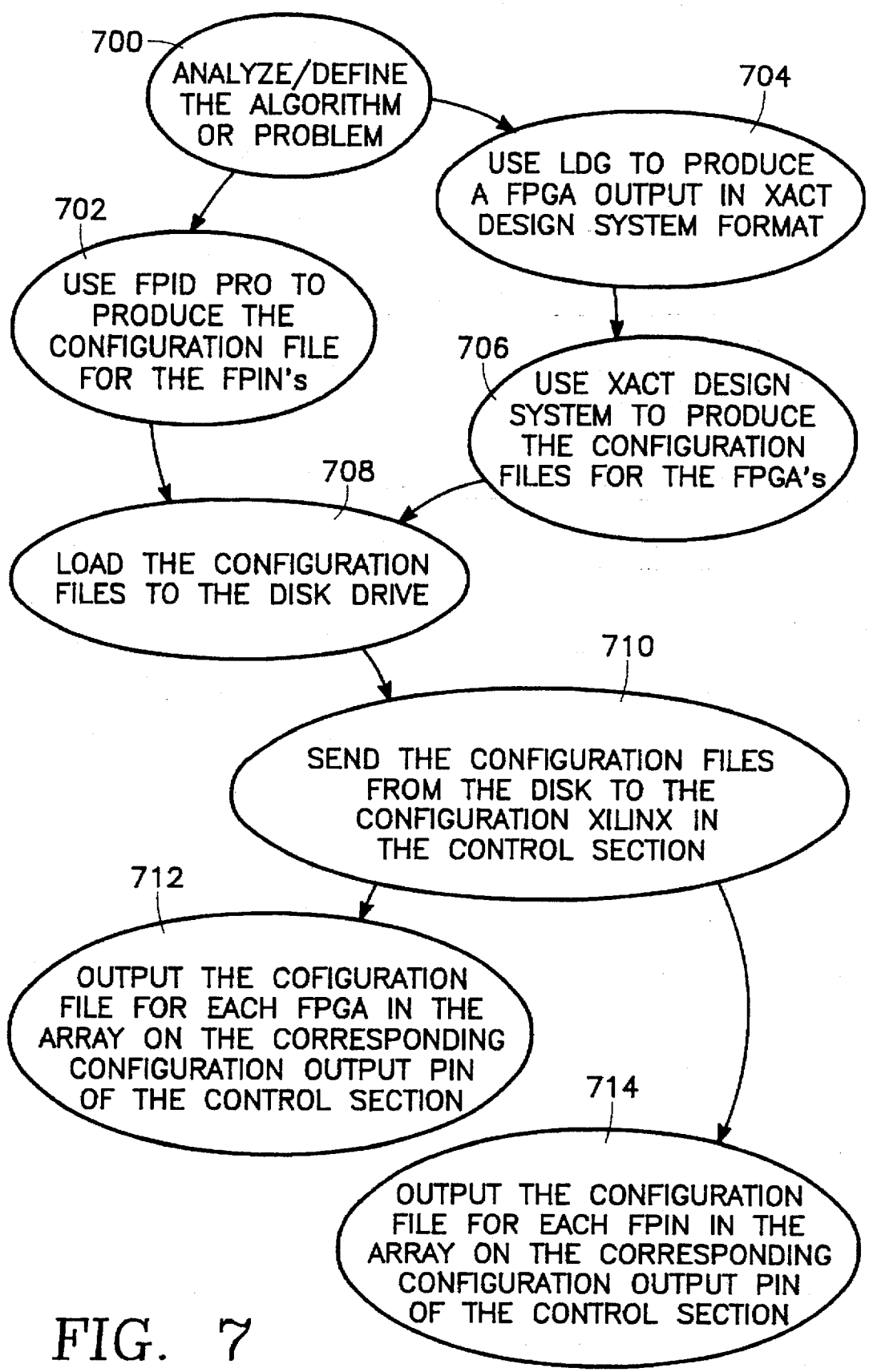
FIG. 7 is a flow diagram of a process employing configuration software applicable to the FPGAs and the FPINs for configuring the virtual computer of FIG. 2.

FIG. 7 illustrates one mode of operation of the virtual computer of the invention. The step of block 700 of FIG. 7 is to analyze and define the current algorithm to be performed. This step requires dividing the algorithm into a number of sub-algorithms corresponding to the number of FPGAs in the array 200, and defining logical connections between the sub-algorithms. Next, the step of block 702 of FIG. 7 is to use the FPID Pro software to produce the configuration file for the FPINs from the logical connections defined in the step of block 700. Then, block 704 of FIG. 7 is to use the LDG software to produce an FPGA output in Xact Design System Format for each FPGA in the array 200 from each one of the sub-algorithms defined in the step of block 700. Next, the step of block 706 is to use the Xact Design System software to produce the configuration files for the FPGAs. Next, the step of block 708 is to load the configuration files to the disk drive. Then, the step of block 710 is to send the configuration files from disk to configuration FPGAs 409, 410 in the control section 206. Next, the step of block 712 is to output the configuration file for each FPGA in the array on the corresponding pin in the two banks 412, 414 of configuration bit output pins in the control section 206. Last, step of block 714 is to output the configuration file for each FPIN in the array on the corresponding configuration bit output pin. The array is then enabled to perform the algorithm. Step 700 is then repeated for the next algorithm to be performed, and then the remaining steps 702 et seq. are repeated. In this manner a succession of algorithms are performed.

Figure 8A:
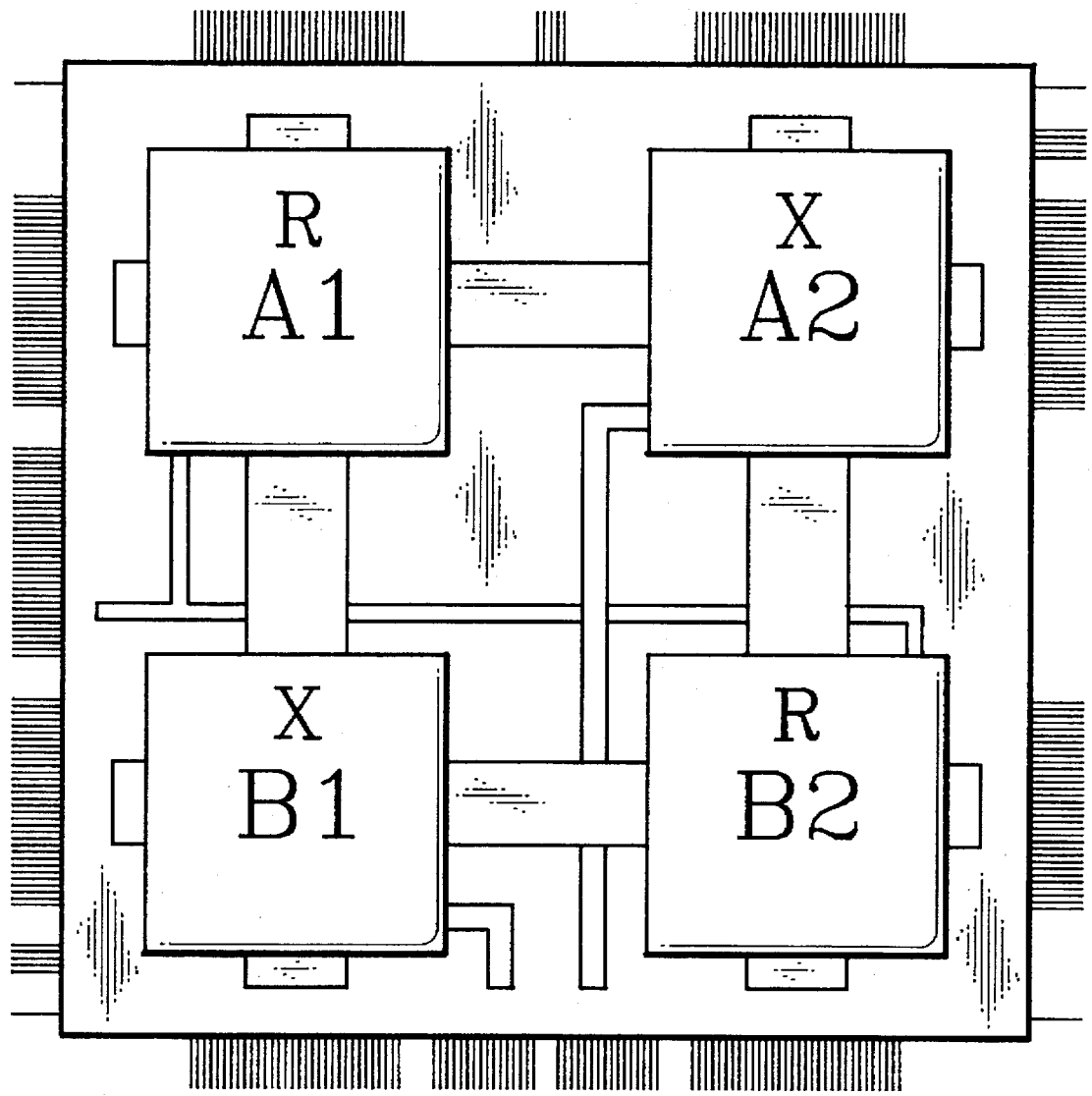
FIGS. 8a and 8b are pin diagrams illustrating one implementation of the elementary cell of FIG. 1.
Figure 8B:
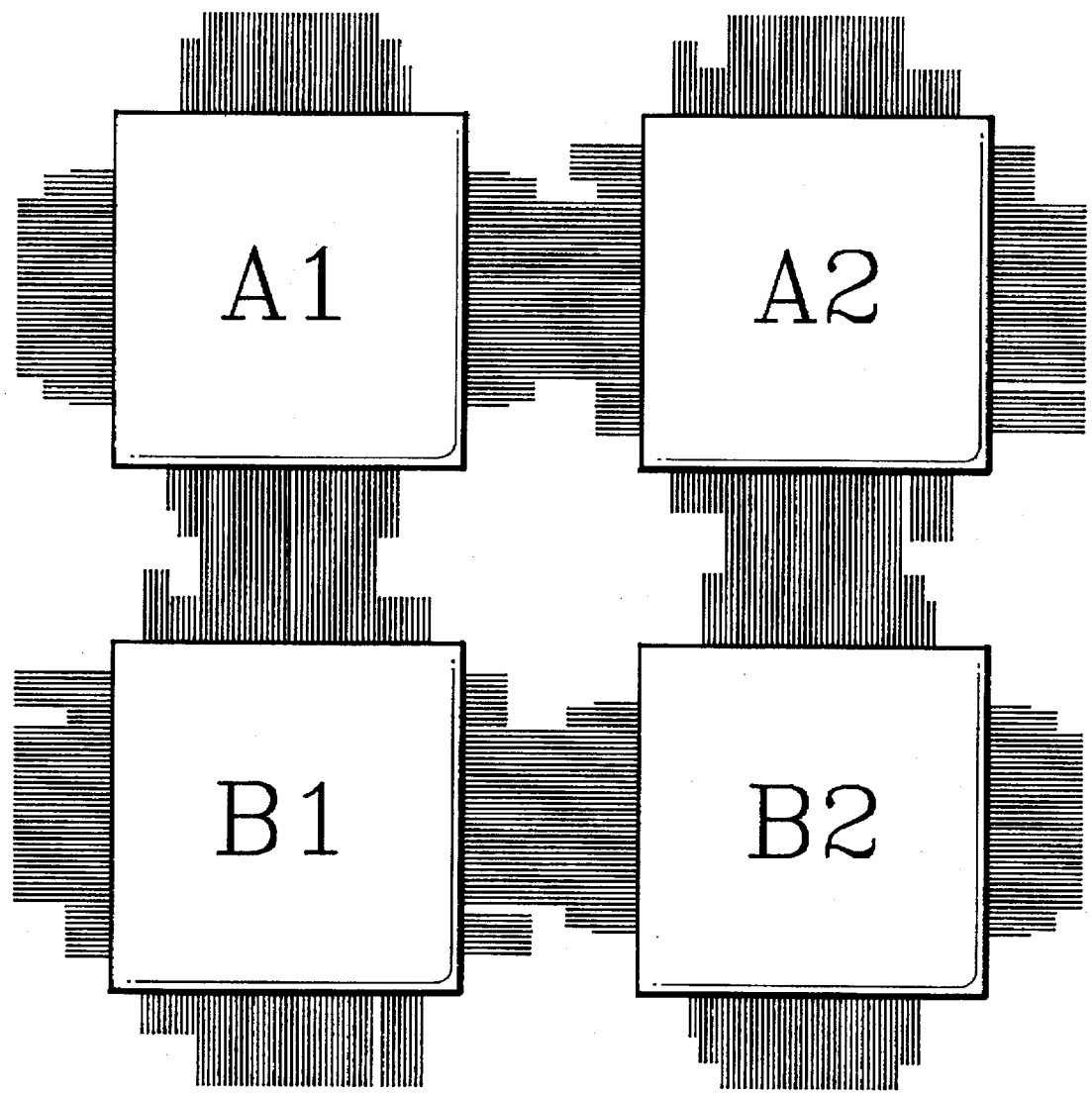
Figure 9:
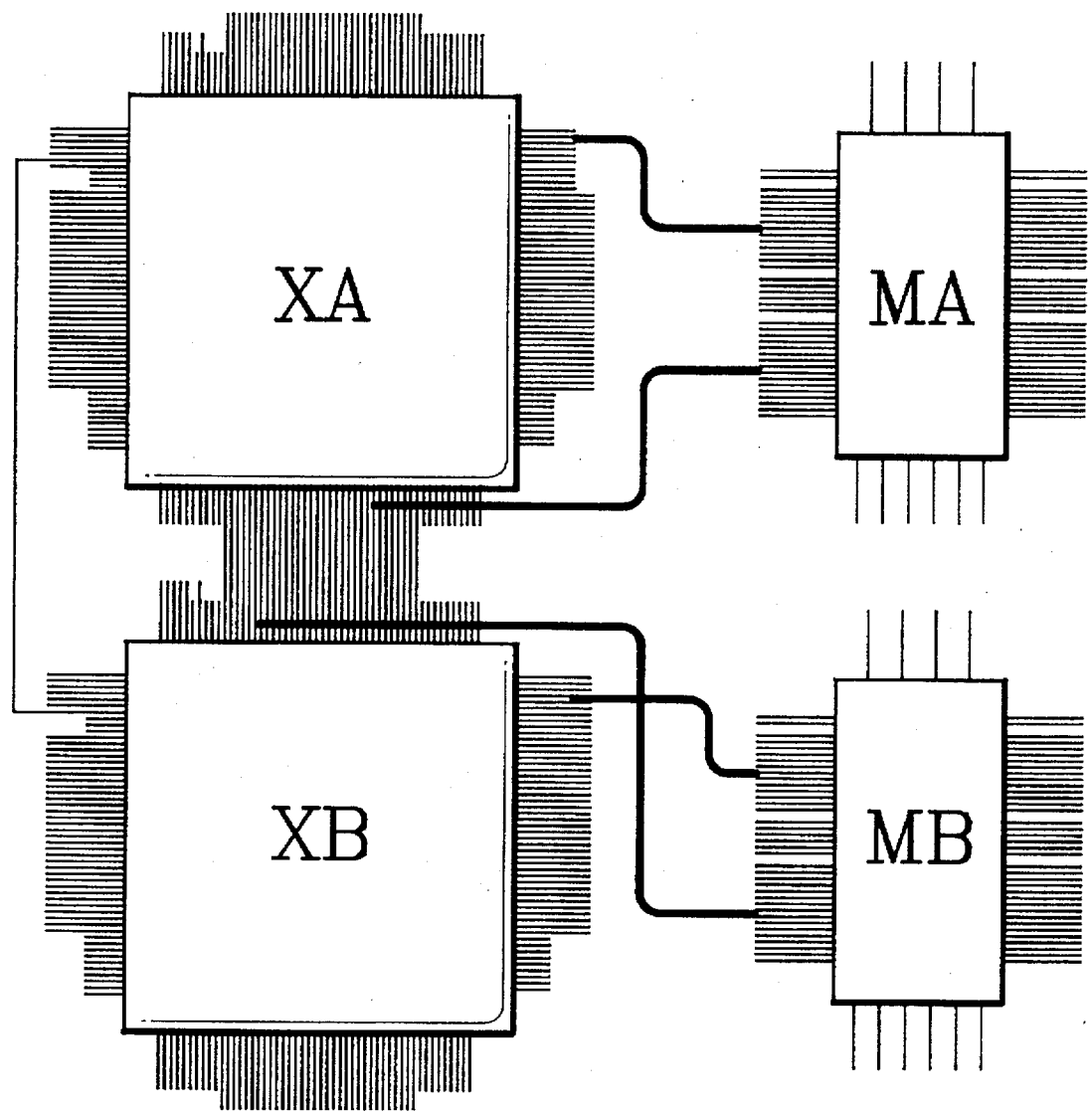
FIG. 9 is a pin diagram of the interconnection between the edge columns of FGPAs and the dual port RAMs in the virtual computer of FIG. 2.

FIGS. 8a and 8b are pin diagrams corresponding to one implementation of the elementary cell of FIG. 1. FIG. 9 is a pin diagram illustrating the connection of a pair of dual-port RAMs to a pair of FPGAs in the right FPGA column 212.

Figure 10:
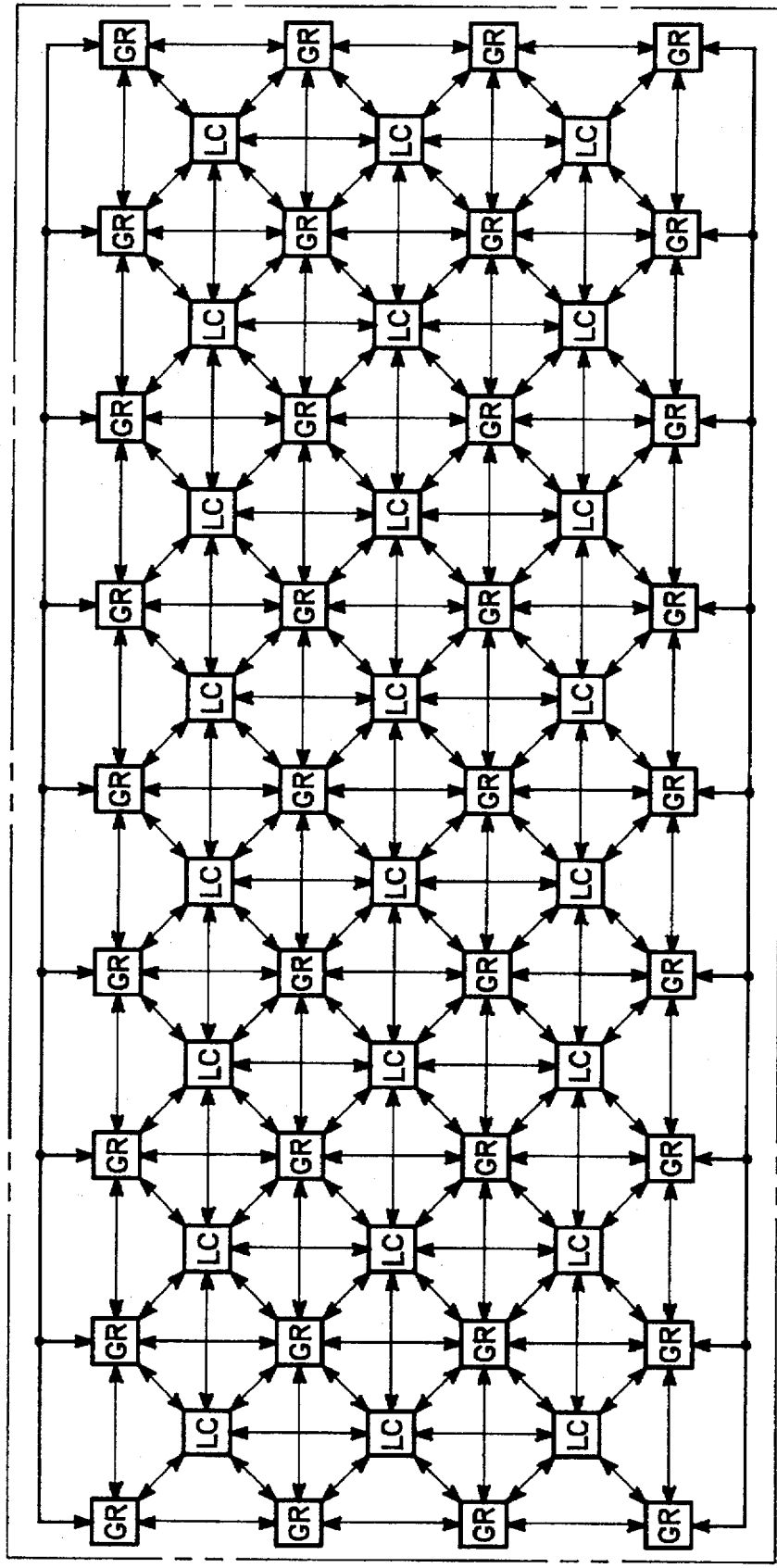
FIG. 10 is a block diagram of an alternative embodiment of an array of FPGAs and FPINs.

FIG. 10 illustrates an alternative embodiment of the array 200 in which each FPGA is connected not only to the four neighboring FPINs (as in FIG. 2) but also to the four neighboring FPGAs, while each FPIN is similarly connected not only to the four neighboring FPGAs (as in FIG. 2) but also to the four neighboring FPINs.

As described above, the FPIN is a multi-pin device which connects any one of its pins with any one of its other pins. The preferred embodiment of the FPIN is an array of two-channel general routing cells (GRCs) of the type illustrated in FIG. 11. This type of FPIN permits one set of configuration files (corresponding to a first algorithm to be performed) to control the FPIN while a second set of configuration files (corresponding to a second algorithm to be performed next) is shifted in through all the cells of the FPIN. The successive bits of the first configuration bit file arrive on data in A (DINA) line 1102, while the successive bits of the second configuration bit file arrive on data in B (DINB) line 1104. A clock signal arrives on clock (CLK) line 1106 and the A/B channel select bit arrives on line 1108.

The DINA and DINB bits are stored respectively in D flip flops 1110 and 1112. The clock line 1106 and the channel select line 1108 are connected to the data and select inputs, respectively of a demultiplexer, whose Y0 and Y1 outputs are applied to the clock inputs of the D flip flops 1110 and 1112 respectively. The Q0 outputs of the D flip flops 1110 and 1112 are routed on data out A (DOUTA) and data out B (DOUTB) lines 1116 and 1118, respectively, to the next (DINA) and (DINB lines 1102, 1104 of the next GRC cell in the array, and also to the D0 and D1 inputs, respectively, of a multiplexer 1120. The multiplexer 1120 applies one of its inputs, D0 or D1, to its Y output, depending upon the state of the A/B signal applied to the select input of the multiplexer 1120. The Y output of the multiplexer 1120 is a bit which determines whether a bi-state switch 1122 (connecting two pins via horizontal and vertical interconnects 1124, 1126) is on or off.

Figure 11:
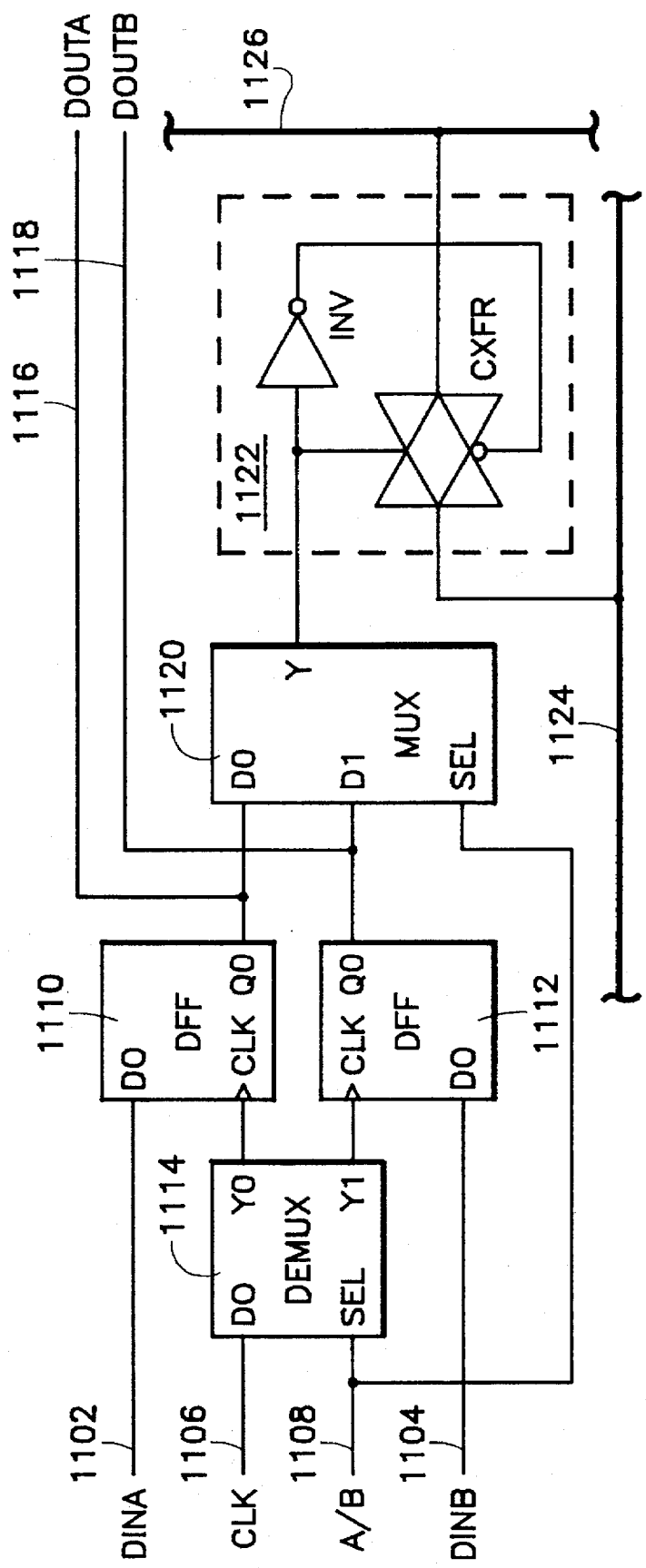
FIG. 11 is a circuit diagram of a general routing cell of the invention.

The GRC cell of FIG. 11 operates as follows: If the A/B bit is high, then the flip flop 1110 holding the A data (DINA) is clocked so that the A data propagates to the next GRC cell via the data A out (DOUTA) line 1116, while simultaneously the flip flop 1112 holding the B data is not clocked so that the B data is held stationary and does not propagate. Instead, the B data bit held in the flip flop 1112 is applied through the multiplexer 1120 to the control input of the switch 1122. This status is maintained as long is it takes one complete configuration bit file to serially propagate through all the GRC cells of the array, until the first bit arrives at the last GRC cell in the serial propagation path. Then, the A configuration data is in place and all the GRC cells in the array are ready to be switched over simultaneously to enable to A configuration data to reconfigure the array. This occurs whenever the A/B channel select signal reverses its state to a low logic state. The multiplexer now applies the clock signal to the flip flop 1112 so that the B data propagates to the next cell on the DOUTA line 1118 while the A data is held stationary in the flip flop 1110. Moreover, the A data stored in the flip flop 1110 is applied by the multiplexer 1120 to the control input of the switch 1122.

Figure 12:
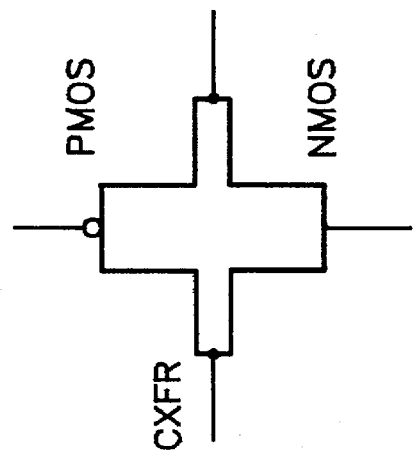
FIG. 12 is a circuit diagram of a CMOS version of the interconnect switch employed in the GRC cell of FIG. 11.

The switch 1122 is preferably a CMOS switch of the type illustrated in FIG. 12 in which the output from the multiplexer 1120 is inverted at the gate of the PMOS device but not at the gate of the NMOS device.

Figure 13:
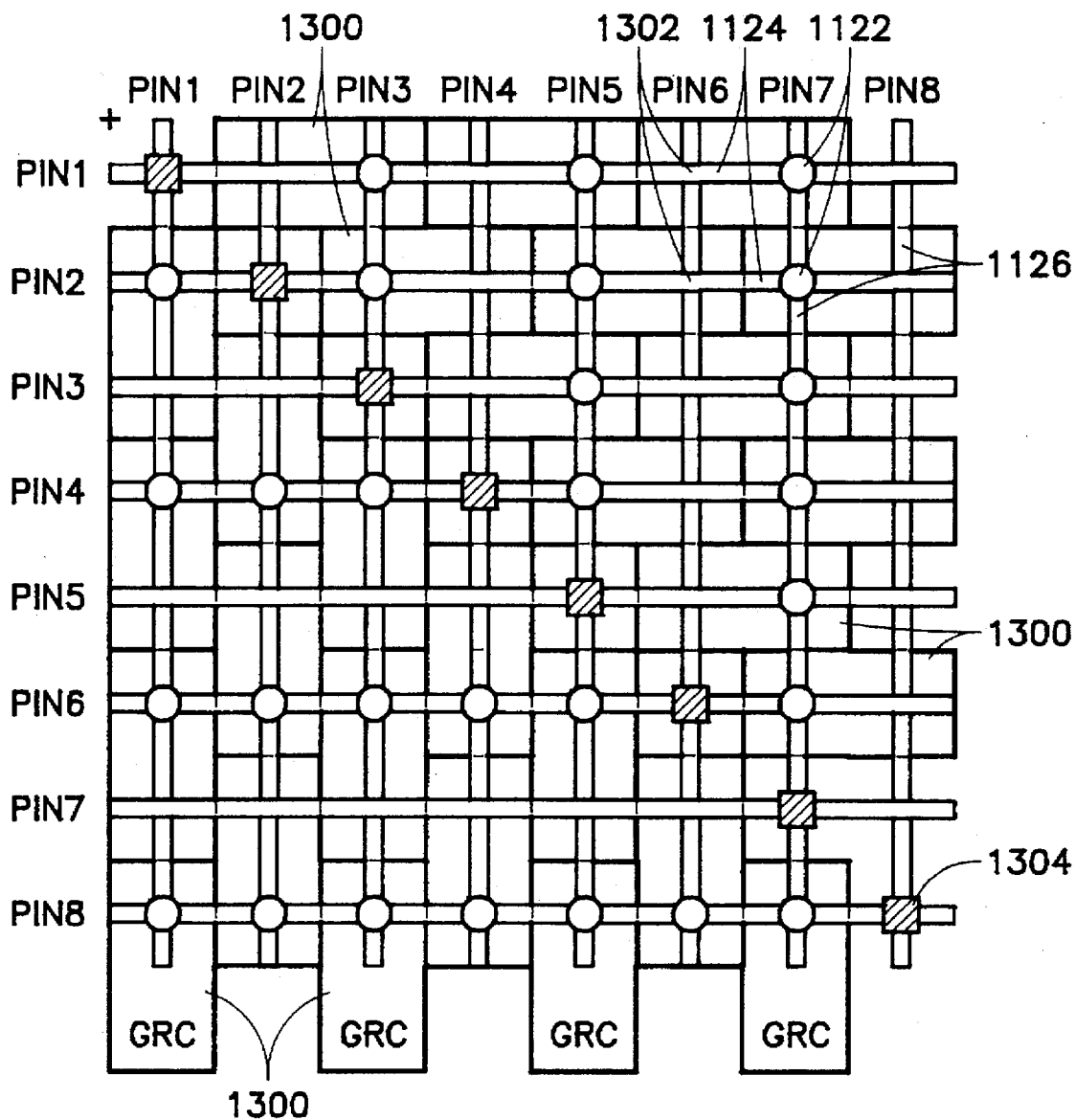
FIG. 13 is a block diagram illustrating horizontal and vertical interconnections in an array of GRC cells of the type corresponding to FIG. 11.

An array of individual GRC cells constituting an 8-pin FPIN in which any pin is programmably connectable to any other pin is illustrated in FIG. 13. Each GRC cell is a rectangular substrate 1300 with top layer metal patterns providing the horizontal and vertical interconnects 1124, 1126 and circuitry for the switch 1122 at the intersection of the horizontal and vertical interconnects and lower layer metal patterns providing the connections between the DOUTA, DOUTB lines of each cell to the DINA, DING lines of the next cell. In addition, a pass-through (unswitched) horizontal interconnect 1302 is provided parallel to and below the horizontal interconnect 1124. In the array of FIG. 13, a second type of cell is used to provide permanent connections, and is a square substrate 1304 with horizontal and vertical interconnect metal patterns permanently connected at their intersection at the center of the substrate 1304. Horizontal or vertical interconnects 1124, 1126 or 1302 of adjacent substrates whose ends are in registration are electrically connected. Each of the programmable substrates 1300 is directional in that data flow to the next cell in the lower layer metal patterns is along the direction of the vertical interconnect 1126, the top layer metal pattern with the end of the vertical interconnect 1126 nearest the switch 1122 being considered the "output" end of the substrate 1300.

Figure 14:
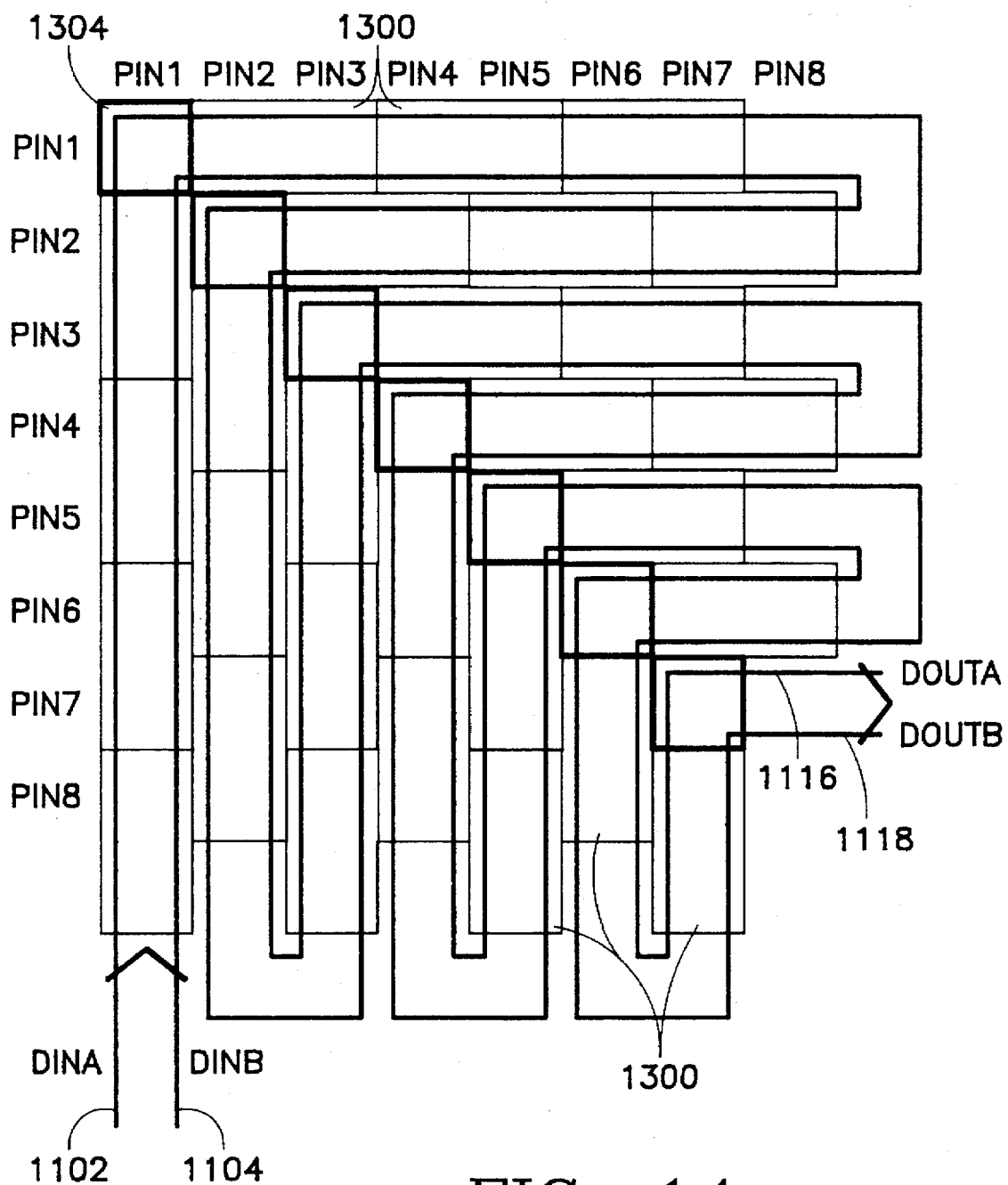
FIG. 14 illustrates the propagation of configuration data throughout the array of FIG. 13.

With the foregoing convention in mind, the layout of the cells in FIG. 13 is in a serpentine pattern, with eight permanent interconnection substrates placed in a diagonal line (block dots denoting the permanent connections). The lower layer metal patterns providing serial flow of configuration data bits through the array of FIG. 13 is illustrated in FIG. 14. It is the lower level metal pattern of FIG. 14 that connects the DOUTA and DOUTB lines 1116, 1118 of one GRC to the DINA and DINB lines 1102, 1104 of the next GRC. FIGS. 13 & 14 also indicate the serpentine pattern in which the GRC cell substrates 1300 are laid out. Generally, beginning at the bottom of the array, the programmable substrates 1300 are laid out in a vertical column end-to-end, the top of the column encountering a permanent connection substrate 1304, interfacing to its right with a horizontal row of programmable substrates 1300. At the right end of alternate rows, connection in the lower metal layer (FIG. 14) is provided to the right end of the next row down, and similarly at the bottom of alternate columns, connection in the lower level metal layer (FIG. 14) is provided to the bottom of the next column.

While the invention has been described in detail by specific reference to preferred embodiments thereof, it is understood that variations and modifications thereof may be made without departing from the true spirit and scope of the invention.

What is claimed is:

1. A computer, comprising:
  a plurality of field programmable gate arrays (FPGAs);
  a plurality of control field programmable gate arrays (control FPGAs), comprising:
    (a) a first group of gates comprising means for generating from each one of a succession of computing operations, corresponding to a succession of instructions defining a program to be executed, a plurality of logic configurations defining (a) an internal logic structure of a corresponding one of said FPGAs and (b) external connections between said corresponding FPGA and others of said FPGAs, whereby to generate a succession of logic configurations for each one of said FPGAs corresponding to said succession of predetermined computing operations; and
    (b) a second group of gates comprising means for configuring each one of said FPGAs in accordance with a corresponding succession of logic configurations, whereby said plurality of FPGAs is successively reconfigured to perform said succession of predetermined computing operations sequentially so as to execute said sequence of instructions.

2. The computer of claim 1 wherein said array of control FPGAs is configured to function as a processor, said computer further comprising a memory connected to said array of control FPGAs and storing a user program containing instructions defining said succession of computing operations, whereby said array of control FPGAs fetches sequential ones of said instructions from said memory for execution in said plurality of FPGAs.

3. The computer of claim 1 wherein said means for configuring comprises means for controlling (a) the internal logic structure of each FPGA and (b) the external connections between each FGPA and others of said FPGAs.

4. The computer of claim 3 wherein:
  said means for controlling comprises means for generating a configuration bit file defining said internal logic structure and said external connections and transmitting at least a portion of said configuration bit file corresponding to said internal logic structure to the corresponding FPGA; and each one of said FPGAs comprises means responsive to receipt of a configuration bit file for conforming internal logic resources of said one FGPA in accordance with said internal logic structure defined by said configuration bit file.

5. The computer of claim 4 wherein said first group of gates is configured to process an input file defining a predetermined computing operation so as to produce a plurality of configuration bit files corresponding to said plurality of FPGAs.

6. The computer of claim 5 further comprising conductor means for providing a configuration bit data path between said array of control FPGAs and said plurality of FPGAs for said configuration bit files.

7. The computer of claim 5 wherein said array of control FPGAs is configured to emulate architecture of a microprocessor capable of executing an object code which generates said configuration bit files from said input file.

8. The computer of claim 6 wherein said conductor means provides parallel bit-serial data paths for each of said configuration files to a respective one of said plurality of FPGAs, whereby said plurality of FPGAs are reconfigurable simultaneously.

9. The computer of claim 6 further comprising a plurality of field programmable interconnect devices (FPINs), each of said FPINs comprising means for providing reconfigurable connections among respective sets of said plurality of FPGAs in conformance with said external connections defined by respective ones of said configuration bit files.

10. The computer of claim 9 wherein:
said means for controlling further comprises means for transmitting a portion of said configuration bit file corresponding to said external connections to a corresponding FPIN; and
each one of said FPINs comprises means responsive to receipt of a configuration bit file for conforming internal connection resources of said one FPIN in accordance with said external connections defined by said configuration bit file.

11. The computer of claim 9 wherein each of said FPINs comprises a plurality of external connections and an array of general routing cells (GRCs), each of said GRCs comprising:
a programmable switch for connecting a corresponding pair of said external connections in response to a configuration bit of a configuration bit file; and
means for controlling said programmable switch in accordance with a corresponding bit of a first configuration bit file while propagating the bits of a second configuration bit file through said array of GRCs along one of said pair of external connections.

12. The computer of claim 11 wherein said array of GRCs is a serpentine array whereby said bits of said second configuration bit file propagate serially in a serpentine path extending through all of said GRCs.

13. The computer of claim 9 wherein said plurality of FPGAs and said plurality of FPINs are arranged in an array of identical building blocks, each building block comprising a pair of FPGAs and a pair of FPINs, each FPGA of said building block being connected to the pair of FPINs of said building block and to two FPINs of adjacent building blocks in said array, and each FPIN of said building block being connected to the pair of FPGAs of said building block and to two FPGAs of adjacent building blocks.

14. The computer of claim 13 further comprising FPGA column buses connected to FPGAs within the same column of said array and FPIN row buses connected to FPINs in the same row of said array.

15. The computer of claim 14 wherein each FPGA comprises five banks of separate external connections to its internal logic resources and wherein each FPIN comprises five banks of separate external connections to its internal connection resources, and wherein four of said five banks of each FPGA connect to four FPINs and the remaining bank connects to an FPGA column bus, while four of said five banks of each FPIN connect to four FPGAs and the remaining bank connects to an FPIN row bus.

16. The computer of claim 15 wherein each of said FPGAs and FPINs has a configuration bit input pin connected by said configuration data path to a configuration bit output pin of one of said control FPGAs.

17. The computer of claim 16 further comprising means for providing a operation data path between said array of control FPGAs and said array of FPGAs and FPINs comprising means for buffering operation data flowing between said control FPGAs and said array of FPGAs and FPINs.

18. The computer of claim 16 further comprising means for connecting each FPGA at an edge of said array of FPGAs and FPINs to an FPGA at an opposite edge thereof in the same row or column and for connecting each FPIN at an edge of said array of FPGAs and FPINs to an FPIN at an opposite edge thereof in the same row or column.

19. A method of operating an array of plural field programmable gates (FPGs) and a controller in order to execute a program defined by a sequence of instructions, comprising:
said controller fetching information defining a succession of computing operations, each of said computing operations corresponding to a respective group of at least a respective one of said sequence of instructions;
said controller generating from said succession of computing operations a corresponding succession of sets of respective plural logic configurations for reinactive ones of said plural FPGs, each of said logic configurations within a set defining (a) an internal logic structure of a corresponding one of said FPGs and (b) external connections between said corresponding FPG and others of said FPGs, whereby to generate a succession of logic configurations for each one of said FPGs corresponding to said succession of computing operations;
said controller configuring each one of said array of FPGs in accordance with a corresponding succession of logic configurations, wherein said array of FPGs is successively reconfigured to perform said succession of computing operations sequentially so as to execute said sequence of instructions of said program.

20. The method of claim 19 wherein said configuring comprises controlling (a) the internal logic structure of each FPG and (b) the external connections between each FPG and others of said FPGs in said array of FPGs.

21. The method of claim 20 wherein:
controlling comprises generating a configuration bit file defining said internal logic structure and said external connections and transmitting at least a portion of said configuration bit file corresponding to said internal logic structure to the corresponding FPG.

22. The method of claim 21 wherein:
said array of FPGs are interconnectable through a plurality of field programmable interconnect devices (FPINs), each of said FPINs providing reconfigurable connections among respective sets of FPGs in said array of FPGs in response to receipt of a corresponding configuration bit file; and said controlling further comprises transmitting a portion of said configuration bit file corresponding to said external connections to a corresponding FPIN.

23. A computer, comprising:

a plurality of field programmable gates (FPGs);

a plurality of control field programmable gates (control FPGs), comprising:

(a) a first group of gates comprising means for generating from each one of a succession of predetermined computing operations a plurality of logic configurations corresponding to said plurality of FPGs, each of said logic configurations defining (a) an internal logic structure of a corresponding one of said FPGs and (b) external connections between said corresponding FPG and others of said FPGs, whereby to generate a succession of logic configurations for each one of said FPGs corresponding to said succession of predetermined computing operations; and (b) a second group of gates comprising means for configuring each one of said FPGs in accordance with a corresponding succession of logic configurations, whereby said plurality of FPGs is successively reconfigured to perform said succession of predetermined computing operations sequentially.

24. The computer of claim 23 wherein said plurality of control FPGs is configured to function as a processor, said computer further comprising a memory connected to said plurality of control FPGs and storing a user program containing instructions defining said succession of computing operations, and said first group of gates of said control FPGs fetches sequential ones of said instructions from said memory for execution in said plurality of FPGs.

25. The computer of claim 23 wherein said means for configuring comprises means for controlling (a) the internal logic structure of each FPG and (b) the external connections between each FGP and others of said FPGs.

26. The computer of claim 25 wherein:

said means for controlling comprises means for generating a configuration bit file defining said internal logic structure and said external connections and transmitting at least a portion of said configuration bit file corresponding to said internal logic structure to the corresponding FPG; and each one of said FPGs comprises means responsive to receipt of a configuration bit file for conforming internal logic resources of said one FGP in accordance with said internal logic structure defined by said configuration bit file.

27. The computer of claim 26 wherein said first group of gates is configured to process an input file defining a predetermined computing operation so as to produce a plurality of configuration bit files corresponding to said plurality of FPGs.

28. The computer of claim 27 wherein said plurality of control FPGs is configured to emulate architecture of a microprocessor capable of executing an object code which generates said configuration bit files from said input file.

29. The computer of claim 27 further comprising conductor means for providing a configuration bit data path between said plurality of control FPGs and said plurality of FPGs for said configuration bit files.

30. The computer of claim 29 wherein said conductor means provides parallel bit-serial data paths for each of said configuration files to a respective one of said plurality of FPGs, whereby said plurality of FPGs are reconfigurable simultaneously.

31. The computer of claim 29 further comprising a plurality of field programmable interconnect devices (FPINs), each of said FPINs comprising means for providing reconfigurable connections among respective sets of said plurality of FPGs in conformance with said external connections defined by respective ones of said configuration bit files.

32. The computer of claim 31 wherein:

said means for controlling further comprises means for transmitting a portion of said configuration bit file corresponding to said external connections to a corresponding FPIN; and each one of said FPINs comprises means responsive to receipt of a configuration bit file for conforming internal connection resources of said one FPIN in accordance with said external connections defined by said configuration bit file.

33. A method of operating an array of field programmable gates (FPGs) connected to an array of control field programmable gates, comprising:

said array of control FPGs fetching information defining a succession of predetermined computing operations;

generating in said control FPGs from each one of said succession of predetermined computing operations a plurality of logic configurations corresponding to said array of FPGs, each of said logic configurations defining (a) an internal logic structure of a corresponding one of said FPGs and (b) external connections between said corresponding FPG and others of said FPGs, whereby to generate a succession of logic configurations for each one of said FPGs corresponding to said succession of predetermined computing operations;

said array of control FPGs configuring each one of said array of FPGs in accordance with a corresponding succession of logic configurations, wherein said array of FPGs is successively reconfigured to perform said succession of predetermined computing operations sequentially.

34. The method of claim 33 wherein said configuring comprises controlling (a) the internal logic structure of each FPG and (b) the external connections between each FPG and others of said FPGs in said array of FPGs.

35. The method of claim 34 wherein:

said controlling comprises generating a configuration bit file defining said internal logic structure and said external connections and transmitting at least a portion of said configuration bit file corresponding to said internal logic structure to the corresponding FPG.

36. The method of claim 35 wherein:

said array of FPGs are interconnectable through a plurality of field programmable interconnect devices (FPINs), each of said FPINs providing reconfigurable connections among respective sets of FPGs in said array of FPGs in response to receipt of a corresponding configuration bit file; and said controlling further comprises transmitting a portion of said configuration bit file corresponding to said external connections to a corresponding FPIN.

* * * * *